United States Patent
Mikami et al.

(10) Patent No.: US 6,475,649 B2
(45) Date of Patent: Nov. 5, 2002

(54) MAGNETIC HEAD

(75) Inventors: Masaaki Mikami, Kawasaki (JP); Takashi Ito, Kawasaki (JP); Takamitsu Orimoto, Kawasaki (JP); Mitsumasa Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/769,239

(22) Filed: Jan. 24, 2001

(65) Prior Publication Data

US 2001/0009062 A1 Jul. 26, 2001

Related U.S. Application Data

(62) Division of application No. 09/193,425, filed on Nov. 17, 1998, now Pat. No. 6,258,283.

(30) Foreign Application Priority Data

Mar. 20, 1998 (JP) .............................. 10-71844

(51) Int. Cl.[7] .............................. G11B 5/127
(52) U.S. Cl. ................... 428/692; 360/327.22
(58) Field of Search .................. 427/131, 264, 427/265, 270, 271; 360/119, 120, 121, 122, 903, 320, 327.22, 324.1, 324.11, 324.12; 428/692, 156, 192

(56) References Cited

U.S. PATENT DOCUMENTS

| | | | |
|---|---|---|---|
| 5,552,327 A | 9/1996 | Bachmann et al. ............ 437/8 |
| 5,892,641 A | 4/1999 | Ishiwata ...................... 360/113 |
| 5,897,969 A | 4/1999 | Taniyama et al. ............ 428/692 |
| 5,949,625 A | * 9/1999 | Sato et al. ................... 360/122 |
| 5,992,004 A | 11/1999 | Sato et al. ................. 29/603.14 |
| 6,166,891 A | * 12/2000 | Lederman et al. ........... 360/313 |
| 6,215,630 B1 | * 4/2001 | Schultz et al. ............... 360/320 |
| 6,249,405 B1 | * 6/2001 | Hoshiya et al. ........... 360/324.1 |

FOREIGN PATENT DOCUMENTS

| | | |
|---|---|---|
| JP | 08203036 | 8/1996 |
| JP | 09129946 | 5/1997 |

* cited by examiner

*Primary Examiner*—Stevan A. Resan
*Assistant Examiner*—Kevin M. Bernatz
(74) *Attorney, Agent, or Firm*—Greer, Burns & Crain, Ltd

(57) ABSTRACT

The method of making the magnetic resistance element comprises the steps of: forming a first magnetizable layer, a non-magnetizable layer and a second magnetizable layer, in this order, on an insulating layer; providing a resist layer for forming a main part of the magnetic resistance element on the second magnetizable layer; etching side faces of the first magnetizable layer, the non-magnetizable layer and the second magnetizable layer to form into slope faces by ion milling from the second magnetizable layer side; forming terminals on the slope faces; and removing the resist layer, wherein a part of the first magnetizable layer which is located outside of the slope faces is left on the insulating layer when the side faces of the first magnetizable layer, the non-magnetizable layer and the second magnetizable layer are etched by ion milling.

2 Claims, 6 Drawing Sheets

MAGNETIC HEAD

This is a continuation divisional, continuation-in-part, of application Ser. No. 09/193,425, filed Nov. 17, 1998, now U.S. Pat. No. 6,258,283.

BACKGROUND OF THE INVENTION

The present invention relates to a method of making a magnetic resistance element, which is employed in a magnetic head of a magnetic disc drive unit, etc.

The magnetic resistance element is capable of detecting a magnetic field by the magnetic resistance effect, and it is employed in the magnetic head of the magnetic disc drive unit, which is capable of reading high density data from a magnetic disc. These days, the disc drive units are made smaller in size but they have large capacity of memory, further high power magnetic heads are required, so the magnetic resistance elements, in which magnetic domains are controlled by ferromagnetic layers, draw engineers' attention.

The magnetic resistance element, in which the magnetic domains are controlled by the ferromagnetic layers, is shown in FIG. 6. An insulating layer 10 is made of an insulator, e.g., alumina, silicon oxide. A first magnetizable layer 12 is formed on the insulating layer 10; a non-magnetizable layer 14 is formed on the first magnetizable layer 12; and a second magnetizable layer 16 is formed on the non-magnetizable layer 14. One of the first and the second magnetizable layers 12 and 16 is a magnetic resistance layer (MR layer), and the other is a bias layer (SAL layer). The SAl layer applies a bias magnetic field to the MR layer so as to detect magnetic data with high sensivity. The non-magnetizable layer 14 is provided between the first and the second magnetizable layers 12 and 16 as a shielding layer. A Ni—Fe layer is employed as the MR layer; an alloy layer, which is made of two or more selected from a group of Ni, Fe, Cr, Rh, Co, etc., is employed as the SAL layer; and a layer made of Ta, Ti or Cr is employed as the non-magnetizable layer.

Planar shapes of the first magnetizable layer 12, the non-magnetizable layer 14 and the second magnetizable layer 16 are rectangular shapes; their side faces are formed into slope faces on which terminals 18 are formed; and they constitute a main part of the magnetic resistance element. The terminals 18 are formed on the slope faces of the main part. Since the terminals 18 are formed on the slope faces, the contact area between the terminals 18 and the first and the second magnetizable layers 12 and 16 can be broader, so that the resistance of the magnetic resistance element can be reduced.

A conventional method of making the magnetic resistance element is shown in FIGS. 7A–7C. In FIG. 7A, the insulating layer 10, the first magnetizable layer 12, the non-magnetizable layer 14 and the second magnetizable layer 16 are formed on a substrate, e.g., a ceramic member. The layers can be formed, in said order, by sputtering.

As shown in FIG. 6, in the case of the magnetic resistance element of the magnetic head, etc., the terminals 18 are formed on the side slope faces. Thus, a resist layer 20, which is formed into a prescribed shape, is formed on an upper face of the second magnetizable layer 16, which is the uppermost layer as a mask, then the layers are etched, with the mask of the resist layer 20, by ion milling, as shown in FIG. 7A. In FIG. 7B, the slope faces, on which the terminals 18 (FIG. C) are formed, are formed in the first magnetizable layer 12, the non-magnetizable layer 14 and the second magnetizable layer 16 by ion milling. A sectional shape of the resist layer 20 has undercut sections, namely a wider section 20a is supported by a supporting section 20b, which is narrower than the wider section 20a. When ions are radiated by ion milling, the slope faces for the terminals 18 are formed by partially shading the ion radiation by the wider section 20a; the terminals 18 can be formed on each slope face.

To form the slope faces in the first magnetizable layer 12, the non-magnetizable layer 14 and the second magnetizable layer 16 by ion milling, they are gradually etched from the second magnetizable layer 16 toward the lower layers. In an are alocated outside of the slope faces on which the terminals 18 are formed, the insulating layer 10 is exposed, so the surface of the insulating layer 10 is slightly overetched, by ion milling, so as to leave no layers on the insulating layer 10. In FIG. 7B, a symbol "L" stands for depth of overetching the insulating layer 10.

In the conventional method, to correctly etch the first magnetizable layer 12, the non-magnetizable layer 14 and the second magnetizable layer 16 by ion milling, the etching is stopped on the basis of the operator's visual observation or on the basis of the time required time to completely remove the first magnetizable layer 12, which has been previously known. Therefore, overetching of the insulating layer 10 cannot be avoided so as to completely remove the first magnetizable layer 12 from the surface of the insulating layer 10.

If the insulating layer 10 is overetched after the slope faces are formed in the first magnetizable layer 12, the non-magnetizable layer 14 and the second magnetizable layer 16, the insulating materials of the insulating layer 10 are scattered and stick onto the slope faces, on which the terminals 18 are formed. In FIG. 7C, the insulating materials 10a of the insulating layer 10 stick on the slope faces, and the terminals 18 are formed thereon.

If the terminals 18 are formed on the slope faces on which the materials 10a have stuck, the magnetic resistance element has the following disadvantages: the resistance between the terminals 18 and the main part is unstable; and therefore the resistance of the magnetic resistance element must be greater.

Further, the first and the second magnetizable layers are heated while forming on the insulating layer 10, atoms of the first magnetizable layer 12 are spread in the insulating layer 10, so that magnetic characteristic of the magnetic resistance element must be worse. In the case that the first magnetizable layer 12 is the SAL layer, if the atoms of the first magnetizable layer 12 are spread in the insulating layer 10, the magnetic characteristic of the first magnetizable layer 12 is changed, and a prescribed bias magnetic field cannot be applied.

SUMMARY OF THE INVENTION

The present invention is intended to solve the above described disadvantages of the conventional magnetic resistance elements, and an object of the present invention is to provide a method of making a magnetic resistance element, which includes the MR layer, the bias layer and the non-magnetizable layer and which has a stable magnetic characteristic and high reliability.

To achive the object, the present invention has the following steps.

Namely, the method comprises the steps of: forming a first magnetizable layer, a non-magnetizable layer and a second magnetizable layer, in this order, on an insulating layer; providing a,resist layer for forming a main part of the magnetic resistance element on the second magnetizable layer; etching side faces of the first magnetizable layer, the non-magnetizable layer and the second magnetizable layer to form into slope faces by ion milling from the second magnetizable layer side; forming terminals on the slope faces; and removing the resist layer, wherein a part of the first megnetizable layer which is located outside of the slope faces is left on the insulating layer when the side faces of the first magnetizable layer, the non-magnetizable layer and the second magnetizable layer are etched by ion milling. With this method, scattering and sticking the materials of the insulating layer onto the slope faces while the etching step can be prevented, so the highly reliable magnetic resistant element can be provided.

In the method, the thickness of the first magnetizable layer may be detected by an end sensor while the first magnetizable layer, the non-magnetizable layer and the second magnetizable layer may be etched by ion milling, so that the first magnetizable layer having a prescribed thickness can be left on the insulating layer. With this method, the thickness of the first magnetizable layer, which is on the insulating layer, can be precisely controlled.

In the method, the end sensor may be capable of detecting the intensity of the light from metallic elements in the first magnetizable layer, and the ion milling may be stopped when a predetermined time is lapsed from a time point at which the end sensor detects the peak of the intensity of the light.

In the method, the thickness of the first magnetizable layer left may be about 30 Å.

And, another method of the present invention comprises the steps of: forming a first magnetizable layer, a non-magnetizable layer and a second magnetizable layer, in this order, on an insulating layer; providing a resist layer for forming a main part of the magnetic resistance element on the second magnetizable layer; etching side faces of the first magnetizable layer, the non-magnetizable layer and the second magnetizable layer to form into slope faces by ion milling from the second magnetizable layer side; forming terminals, each of which is formed on the insulating layer and the slope faces; and removing the resist layer, wherein an intermediate layer, whose resistivity is greater than that of the first and the second magnetizable layers, is formed between the insulating layer and the first magnetizable layer, and wherein a part of the intermediate layer which is located outside of the main part is left on the insulating layer when the main part is etched by ion milling.

In the method, the intermediate layer may be made of a non-magnetizable material such as Ti, Ta, Cr.

In the methods, one of the first and the second magnetizable layers is an MR layer, and the other is an SAL layer.

In the method of the present invention, the magnetizable layer is left on the insulating layer when the layers are etched by ion milling, so the main part of the magnetic resistance element can be formed without sticking the insulating materials of the insulating layer onto the slope faces, on which the terminals are formed, and the magnetic resistance element having excellent magnetic characteristic and high reliability can be made. And, a magnetic resistance element having excellent magnetic characteristic can be made by providing the magnetizable layer between the insulating layer and the first magnetizable layer.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Preferred embodiments of the present invention will now be described in detail with reference to the accompanying drawings.

FIGS. 1A–1D are the explanation views showing the method of making the magnetic resistance element of a first embodiment of the present invention. In the method of the present embodiment, the MR layer, the bias layer and the non-magnetizable layer are formed on the insulating layer, and the layers are etched by ion milling as well as the conventional magnetic resistance element.

Figure 1A:
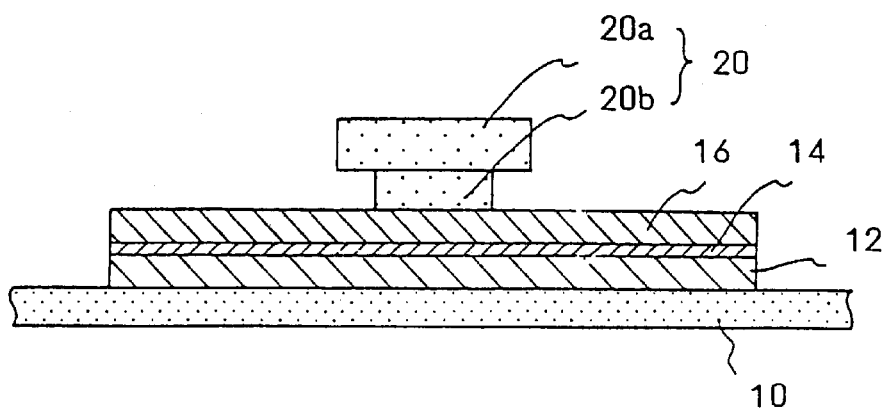
FIGS. 1A–1D are explanation views showing the method of making the magnetic resistance element of an embodiment of the present invention.

In FIG. 1A, the first magnetizable layer 12 is formed on the insulating layer 10; the second magnetizable layer 16 is formed on the first magnetizable layer 12 as the MR layer. In the present embodiment, thickness of the first magnetizable layer 12, which works as the SAL layer, is 0.01 μm; thickness of the non-magnetizable layer 14, which is made of Ta, is 0.01 μm; thickness of the second magnetizable layer 16, which is made of Ni—Fe alloy, is 0.01 μm. The layers are formed by spattering.

The resist layer 20 is provided to form the slope faces, on which the terminals 18 are formed, and the main part of the magnetic resistance element by ion milling. The wider section 20a may be, made of alumina instead of the resist.

The characteristic point of the method of the present embodiment is that the layers are etched by ion milling and the ion milling is stopped, by an end sensor 30, immediately before the insulating layer 10 is exposed.

Figure 1B:
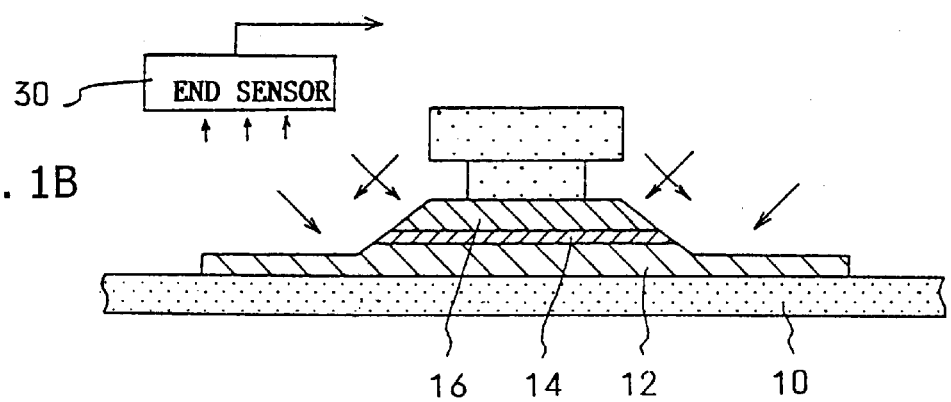

In FIG. 1B, the etching has been executed from the second magnetizable layer 16, which is the uppermost layer, to the first magnetizable layer 12.

Figure 1C:
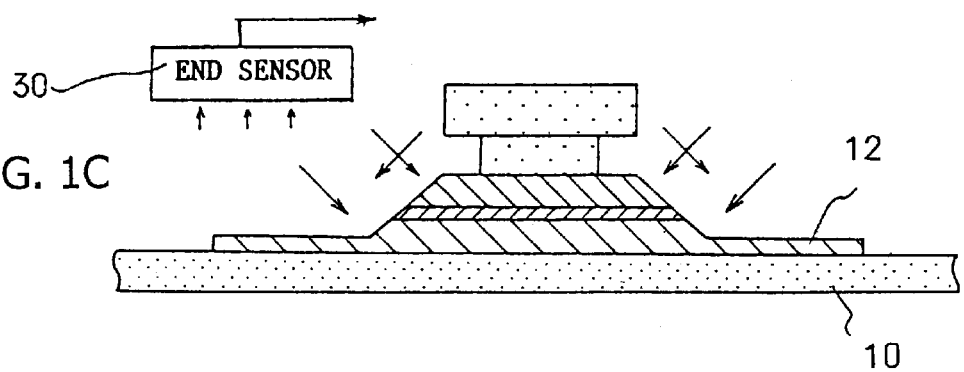

In FIG. 1C, end of the etching the first magnetizable layer 12 is detected. It is to be desired that the first magnetizable layer 12 should be removed from the surface of the insulating layer 10. However, if the insulating layer 10 is etched by ion milling, the insulating materials will stick onto the slope faces, which are formed by etching the first and the second magnetizable layers 12 and 16, as well as the conventional method, so the ion milling is stopped when the thickness of the first magnetizable layer 12, which is left on the surface of the insulating layer 10, reaches about 30 Å in the present embodiment.

The thickness of the first magnetizable layer 12, which is left on the insulating layer 10, is about 30 Å, so the resistance of the magnetic resistance element is not badly influenced even if the terminals 18 are formed onto the insulating layer 10. By the conventional ion milling method too, the thin first magnetizable layer 12 can be left on the surface of the insulating layer 10. However, it is difficult to precisely control the thickness of the layer left by visual observation or time control, so the thickness of the layer left will be widely dispersed, and the characteristic of the magnetic resistance element will be influenced if the thickness of the layer left on the insulating layer 10 is thicker.

In the present embodiment, the thickness of the first magnetizable layer 12, which is left on the insulating layer 10, can be precisely controlled by using the end sensor 30.

The end sensor 30 of the present embodiment detects intensity of light, which is radiated from the metallic elements constituting the magnetizable layer during the ion milling. For example, the first and the second magnetizable layers 12 and 16 include nickel as the metallic element, so the intensity of the light radiated from nickel is analyzed during the ion milling so as to detect the thickness of the layer or layers.

Figure 2:
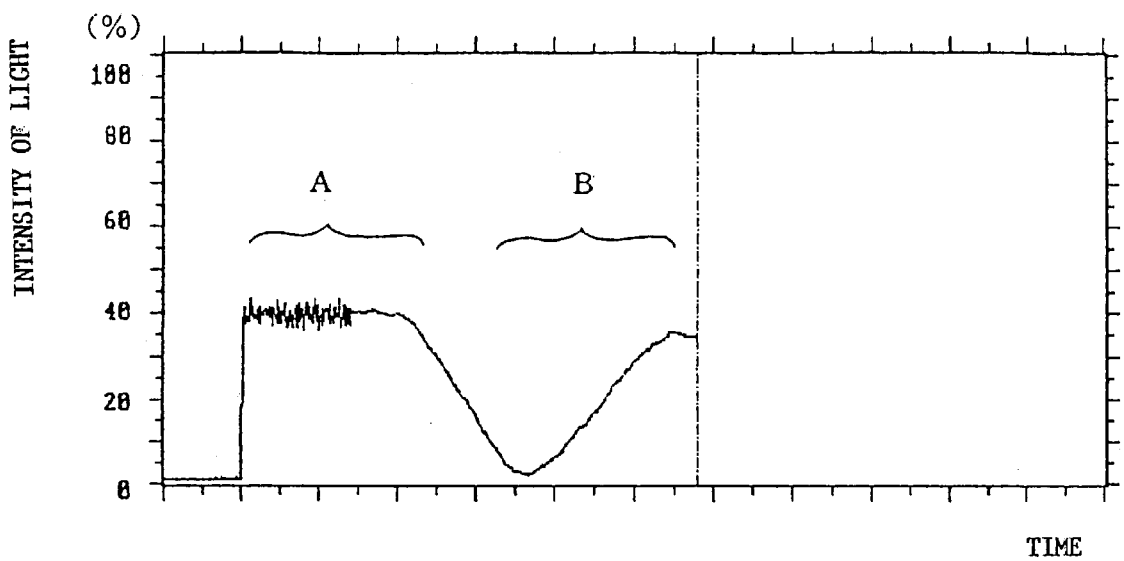
FIG. 2 is a graph showing change of intensity of light while etching the magnetizable layer, etc. by ion milling.
Figure 3:
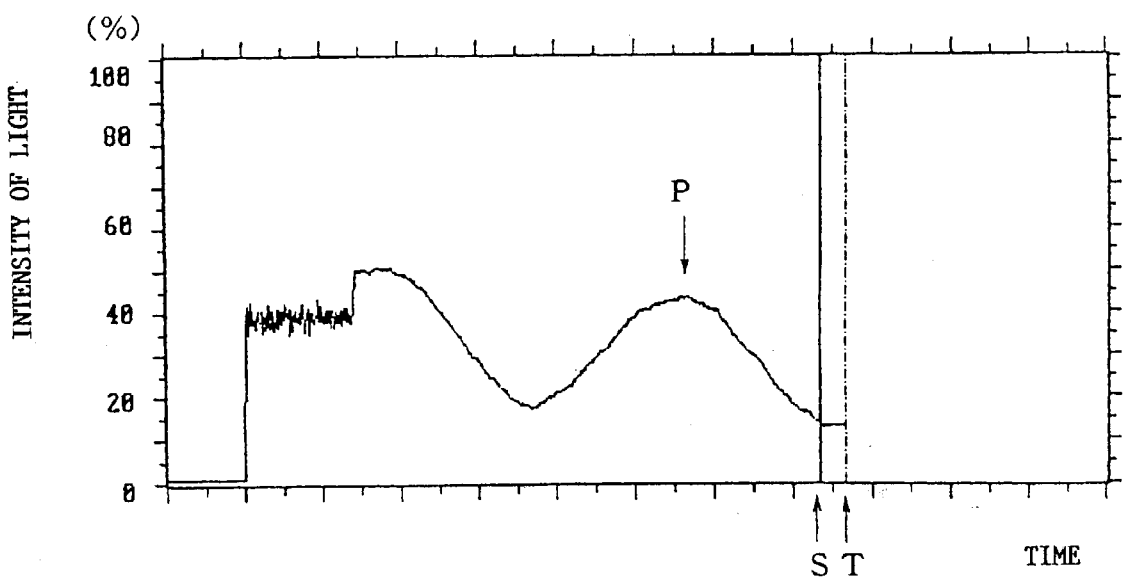
FIG. 3 is a graph showing change of the intensity of the light while etching the magnetizable layer, etc. by ion milling.
Figure 4:
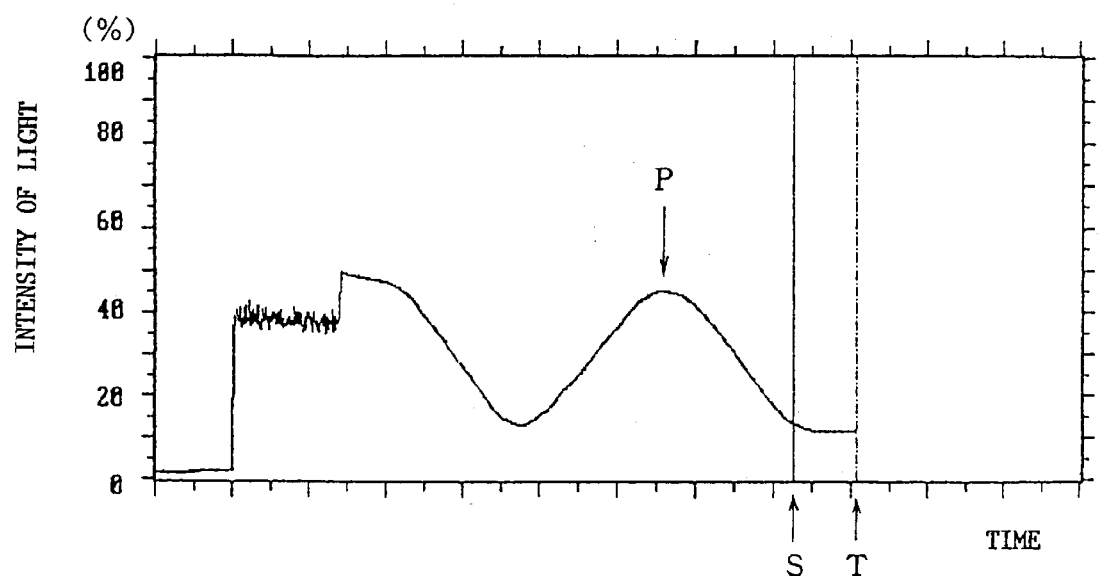
FIG. 4 is a graph showing the change of the intensity of the light while etching the magnetizable layer, etc. by ion milling.

The results of analyzing the intensity of the light are shown in FIGS. 2–4. In FIGS. 2–4, the axes of abscissas indicate the time of the ion milling; the axes of ordinates indicate the intensity of the radiated light.

FIG. 2 shows the change of the intensity of the light while executing the ion milling from the second magnetizable layer 16 to the first magnetizable layer 12 via the non-magnetizable layer 14. In a part "A", the second magnetizable layer 16 radiates the light; in a part "B", the thickness of the second magnetizable layer 16 is gradually made thinner, the non-magnetizable layer 14 is etched, and the intensity of the light radiated from the first magnetizable layer 12 reaches the peak. Since no nickel is included in the non-magnetizable layer 14, the intensity is at a minimum while etching the intermediate non-magnetizable layer 14.

As shown in FIG. 2, the intensity of the light, which is detected by the sensor 30, changes according to the thickness of the magnetizable layers, so the thickness of the first magnetizable layer 12, which will be left on the insulating layer 10, can be controlled by monitoring the change of the intensity of the light after the etching reaches the first magnetizable layer 12. For example, as shown in FIGS. 3 and 4, firstly the peak "P" of the intensity of the light while etching the first magnetizable layer 12 is detected, then the the ion milling is stopped when a predetermined time is lapsed from the peak "P".

In FIGS. 3 and 4, a symbol "T" indicates the time point at which the first magnetizable layer 12 is completely removed from the insulating layer 10 by ion milling; a symbol "S" indicates the time point at which the ion milling is stopped so as to leave the first magnetizable layer 12,whose thickness is about 30 Å on the insulating layer 10. The end of etching the first magnetizable layer 12 can be known as described above, so the thickness of the first magnetizable layer 12, which will be left on the insulating layer 10, can be properly controlled by stopping the ion milling proper time prior to the end time point (the time point "T").

In the present embodiment, the peak point (the point "P") of the intensity of the light radiated from the first magnetizable layer 12 is detected, then the ion milling is stopped when the predetermined time is lapsed from the time point "P". The relationship between the thickness of the layers and the etching rate by ion milling are previously known, so the time point "S" at which the ion milling is stopped is selected according to products so as to precisely control the thickness of the layer left on the-surface of the insulating layer 10. FIG. 4 is the results of another example in which the thickness of the layers are different. By selecting the time point of stopping the ion milling (the time point "S") according to products, the thickness of the layers can be properly controlled.

Figure 1D:
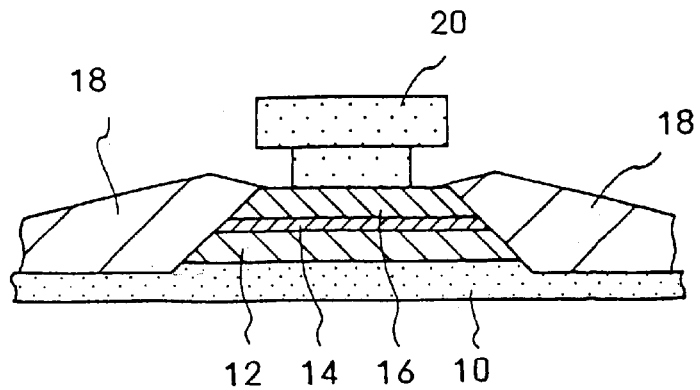

In FIG. 1D, the etching is executed until reaching the first magnetizable layer 12, then the terminals 18 are formed. Since the first magnetizable layer 12 left on the insulating layer 10 is quite thin, it is not shown therein. After the terminals 18 are formed, the resist 20 is melted and removed, so that the magnetic resistance element, in which the MR layer and the SAL layer are magnetically separated by the non-magnetizable layer, can be made.

To control the thickness of the magnetizable layer by analyzing the intensity of the light radiated from the metallic elements in the magnetizable layer while the ion milling is much more advantageous than the conventional method, in which the thickness is controlled by visual observation or controlling the etching time. In the present embodiment, dispersion of the thickness of the first magnetizable layer 12 left on the insulating layer 10 cannot be avoided, but the degree of the dispersion of the present embodiment can be reduced to ⅓ of the conventional method's or less.

By leaving the first magnetizable layer 12 on the surface of the insulating layer 10, the insulating materials, which are scattered from the insulating layer 10 by ion milling, can be prevented to stick onto the surfaces of the first and the second magnetizable layers 12 and 16, so that the resistance of the magnetic resistance element can be reduced. Since the degree of the dispersion of the thickness of the magnetizable layer left on the surface of the insulating layer 10 can be reduced, the magnetic resistance elements, whose dispersion of characteristics is small and which have high reliability, can be provided.

In the present embodiment, the first and the second magnetizable layers 12 and 16 include nickel, so the thickness of the layers are detected on the basis of the intensity of the light radiated from nickel. Various materials may be employed in the magnetizable layers, so the thickness of the layers can be controlled by detecting the intensity of the light radiated from the metallic element, which is selected on the basis of the wave length, etc.

In the present embodiment, the first magnetizable layer 12 works as the SAL layer and the second magnetizable layer 16 works as the MR layer; in the case that the first magnetizable layer 12 is MR layer and the second magnetizable layer 16 is the SAL layer, the thickness of the layers can be controlled as well.

Figure 5A:
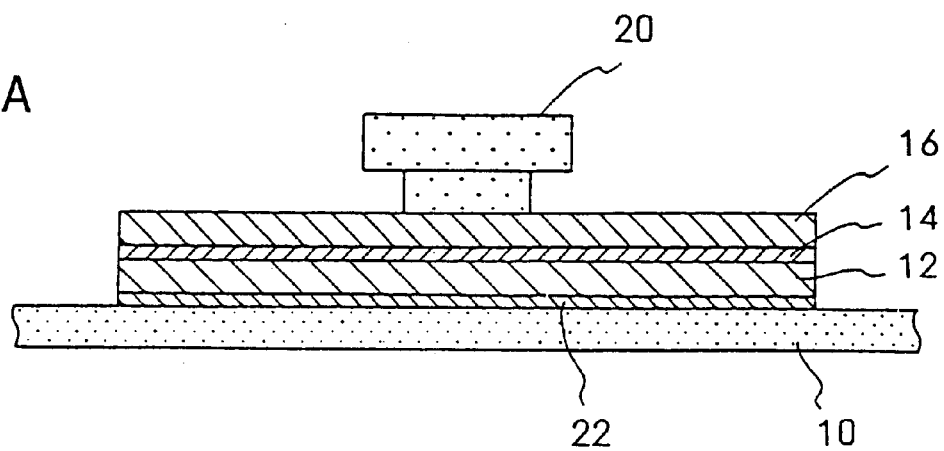
FIGS. 5A–5C are explanation views showing the method of making the magnetic resistance element of another embodiment of the present invention.

Another method, in which the magnetic resistance element is made without etching the insulating layer 10, will be explained in FIGS. 5A–5C. The characteristic point of this embodiment is an intermediate layer 22, which is formed between the insulating layer 10 and the first magnetizable layer 12 and which prevents the insulating layer 10 from being overetched during the ion milling. In FIG. 5A, the intermediate layer 22 is formed on the insulating layer 10, and the first magnetizable layer 12, the non-magnetizable layer 14 and the second magnetizable layer 16 are also formed on the insulating layer 10.

The intermediate layer 22 protects and prevents the insulating layer 10 from being etched during the ion milling, so it covers over a part of the insulating layer 10 to which ions are radiated during the ion milling.

Figure 5B:
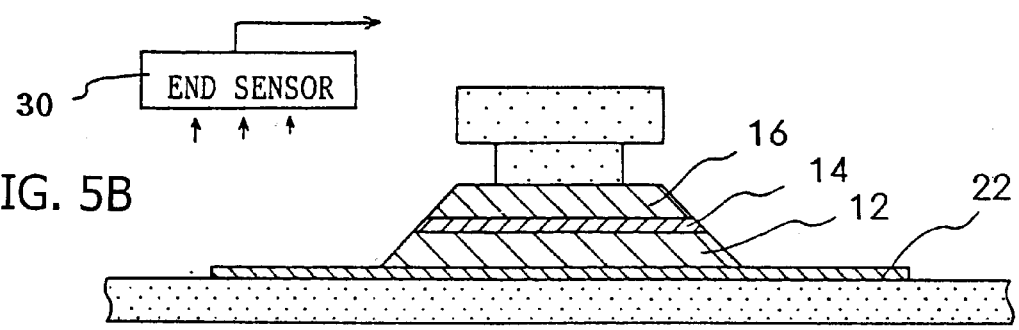
Figure 5C:
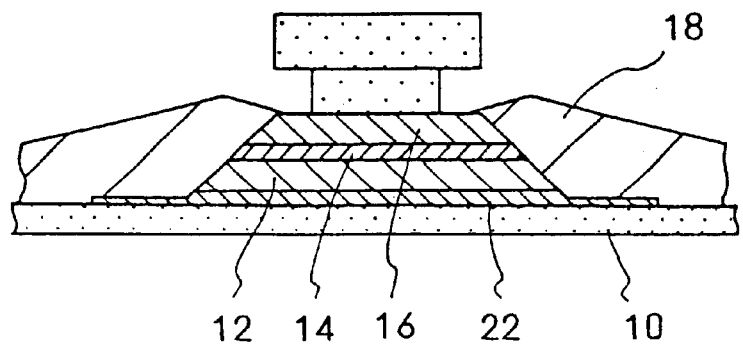
Figure 6:
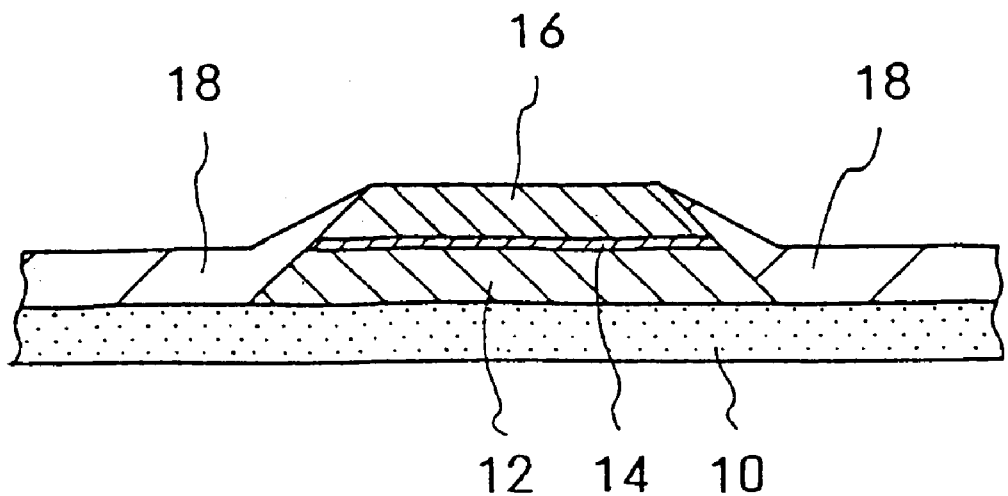
FIG. 6 is a sectional view of the magnetic resistance element.
Figure 7A:
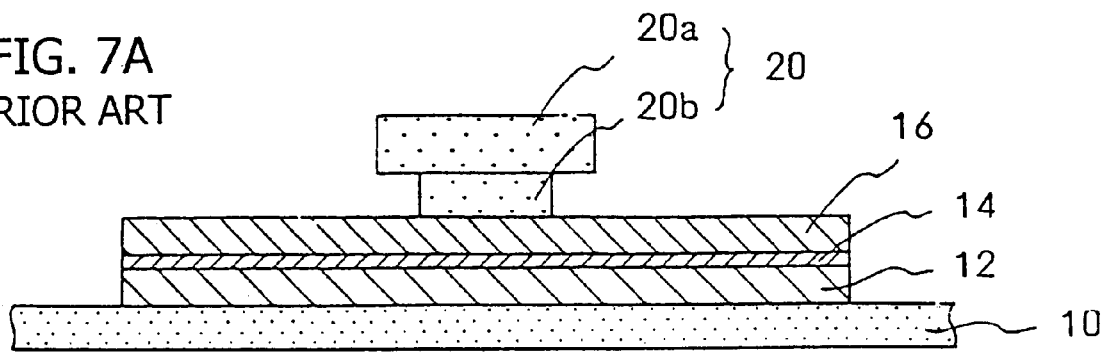
FIGS. 7A–7C are explanation views showing the conventional method of making the magnetic resistance element.
Figure 7B:
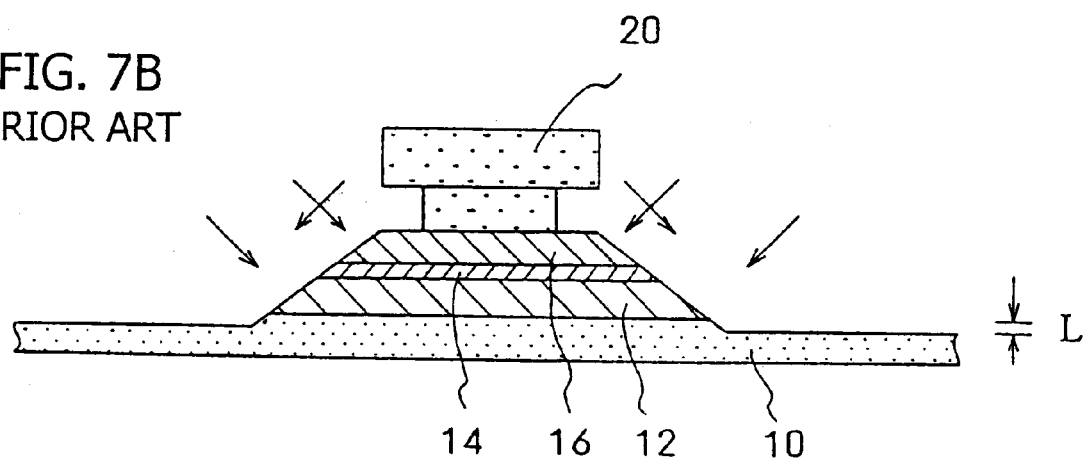
Figure 7C:
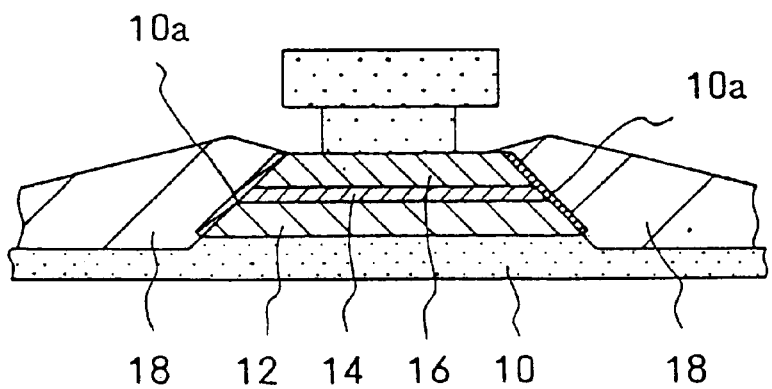

In FIG. 5B, the first magnetizable layer 12, the non-magnetizable layer 14 and the second magnetizable layer 16 are etched by ion milling. The intermediate layer 22 is exposed by etching the first magnetizable layer 12, the non-magnetizable layer 14 and the second magnetizable layer 16, but the insulating layer 10 is covered with the intermediate layer 22 and protected from the ion milling, so the insulating layer 10 is not etched until the the intermediate layer 22 is removed by etching.

Namely, the ion milling is stopped when the first magnetizable layer 12 is etched until the intermediate layer 22 is exposed, so that etching the insulating layer 10 can be prevented. To stop the etching when the first magnetizable layer 12 is removed and the intermediate layer 22 is exposed, the end sensor 30 is employed to detect the end of the first magnetizable layer 12 as well as the foregoing embodiment; further, if the thickness of the intermediate layer 22 has the proper thickness, the termination of the etching process may be controlled on the basis of the length of time of the ion milling. In the case of the time control, the insulating layer 10 is not etched even if the time length of the ion milling is set to slightly overetch the intermediate layer 22. The thickness of the intermediate layer 22 may be about 20–100 Å.

In the case of forming the intermediate layer 22, the intermediate layer 22 must be made of a material having greater resistivity. The reason is that the terminals 18 are formed on the first and the second magnetizable layers 12 and 16 in a state in which the intermediate layer 22 is left as shown in FIG. 5C, so electric current passing between the terminals 18 via the intermediate layer 22 must be prevented. Namely, the resistivity of the intermediate layer 22 must be greater than that of the first and the second magnetizable layers 12 and 16.

The intermediate layer 22 may be made of a non-magnetizable material such as Ti, Ta, Cr, whose resistivity is twice or more as great as that of the MR layer.

Note that, the first magnetizable layer 12, the non-magnetizable layer 14, the second magnetizable layer 16, etc. are heated during the forming process, but the intermediate layer 22 prevents the atoms of the first magnetizable layer 12 from spreading into the insulating layer 10. For example, in the case of forming the intermediate layer 22 on the insulating layer 10 which is made of alumina, silicon oxide, etc., the atoms of the first magnetizable layer 12 cannot spread into the insulating layer 10 even if the first and the second magnetizable layers 12 and 16 are heated. With this structure, the characteristic of the first magnetizable layer 12 can be kept even if it is heated during the forming process. It is important for the magnetic resistance elements having higher stability and reliability to keep the characteristics of the first magnetizable layer 12, etc. during the process of making the magnetic resistance elements.

The invention may be embodied in other specific forms without departing the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A magnetic head comprising:
   a magnetic resistance element proper including a magneto-resistive film, a non-magnetizable layer and a magnetizable layer, which are formed, in this order, on an insulating layer;
   slope faces being formed on side faces of said magnetic resistance element proper; and
   terminals being formed on said slope faces,
   wherein said magneto-resistive film includes a portion with a reduced thickness that is located outside of said magnetic resistance element proper, and is positioned on said insulating layer, and
   further wherein said terminals are formed on said slope faces and said reduced thickness portion of said magneto-resistive film.

2. A magnetic head comprising:
   a magnetic resistance element proper including a magneto-resistive film, a non-magnetizable layer and a magnetizable layer, which are formed, in this order, on an insulating layer;
   an intermediate layer, which is an electric conductive non-magnetizable layer and whose resistivity is greater than that of said magneto-resistive film and said magnetizable layer, being formed between said insulating layer and said magneto-resistive film;
   slope faces being formed in side faces of said magnetic resistance element proper; and
   terminals being formed on said slope faces,
   wherein said intermediate layer includes a reduced thickness portion that is located outside of said magnetic resistive element proper, and is positioned on said insulating layer, and
   further wherein said terminals are formed on said slope faces and said reduced thickness portion of said intermediate layer.

* * * * *

UNITED STATES PATENT AND TRADEMARK OFFICE
CERTIFICATE OF CORRECTION

PATENT NO.    : 6,475,649 B2                                    Page 1 of 1
DATED         : November 5, 2002
INVENTOR(S)   : Mikami et al.

It is certified that error appears in the above-identified patent and that said Letters Patent is hereby corrected as shown below:

<u>Title page, Item [54] and Column 1, line 1,</u>
Delete "MAGNETIC HEAD" and insert -- MAGNETIC HEAD WHEREIN THE MR FILM DEPOSITED ON THE INSULATED LAYER IS ONLY PARTIALLY REMOVED --.
Item [57], ABSTRACT,
Line 1, please replace "The method of making the" with -- A --
Line 2, please replace "comprises the steps of: forming" with -- including --
Lines 4-6, please replace "providing a resist layer for forming a main part of the magnetic resistance element on the second magnetizable layer; etching" with -- wherein the --
Line 8, please replace "to form into" with -- have --
Lines 8-10, please delete "by ion milling from the second magnetizable layer side; forming terminals on the slope faces; and removing the resist layer,"
Lines 12-15, please delete "when the side faces of the first magnetizable layer, the non-magnetizable layer and the second magnetizable layer are etched by ion milling."

<u>Column 1,</u>
Line 3, please replace "This is a continuation divisional, continuation-in-part, of application Ser. No. 09/193,425, filed Nov. 17, 1998, now U.S. Pat. No. 6,258,283" with -- This is a divisional of application Ser. No. 09/193,425, filed November 17, 1998, now U.S. Patent No. 6,258,283 --.

Signed and Sealed this

Seventeenth Day of June, 2003

JAMES E. ROGAN
*Director of the United States Patent and Trademark Office*